United States Patent
Schaper et al.

(10) Patent No.: US 10,310,001 B2
(45) Date of Patent: Jun. 4, 2019

(54) SHORT-CIRCUIT SENSOR

(71) Applicant: Phoenix Contact GmbH Co. KG, Blomberg (DE)

(72) Inventors: Elmar Schaper, Lügde (DE); Peter Scholz, Brakel (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 299 days.

(21) Appl. No.: 15/306,973

(22) PCT Filed: Mar. 23, 2015

(86) PCT No.: PCT/EP2015/056081
§ 371 (c)(1),
(2) Date: Dec. 22, 2016

(87) PCT Pub. No.: WO2015/165646
PCT Pub. Date: Nov. 5, 2015

(65) Prior Publication Data
US 2017/0131338 A1    May 11, 2017

(30) Foreign Application Priority Data
Apr. 30, 2014  (DE) .................. 10 2014 106 130

(51) Int. Cl.
*G01R 31/00* (2006.01)
*G01R 31/02* (2006.01)

(52) U.S. Cl.
CPC .......... *G01R 31/025* (2013.01); *G01R 31/021* (2013.01)

(58) Field of Classification Search
CPC combination set(s) only.
See application file for complete search history.

(56) References Cited

U.S. PATENT DOCUMENTS 4,426,670 A * 1/1984 Ilar .................... H02H 3/48
                                                       361/42
6,130,530 A * 10/2000 McNulty ............. G01R 15/12
                                                      324/546

(Continued)

FOREIGN PATENT DOCUMENTS

DE  10 2008 004 869 A1  7/2009
DE  10 2011 075 567 A1  11/2012
WO  WO-95/25374 A1      9/1995

OTHER PUBLICATIONS

ISA/EP International Search Report, Int'l Application No. PCT/EP2015/056081, dated Jun. 3, 2015, European Patent Office, Rijswijk, NL, 24 pgs.

(Continued)

*Primary Examiner* — Vincent Q Nguyen
(74) *Attorney, Agent, or Firm* — Holland & Hart LLP

(57) ABSTRACT

The present disclosure relates to a short-circuit sensor for detecting a short-circuit current in an electrical line. The short-circuit sensor includes an integrator, a coupling device, and a detection device. The coupling device is configured to inductively couple the integrator to the electrical line and to supply an induced signal to the integrator. The integrator is configured to integrate the induced signal to obtain an integrated signal. The detection device is configured to compare an amplitude value of the integrated signal with a prescribed threshold value and to detect the short-circuit current if the amplitude value of the integrated signal exceeds the prescribed threshold value.

16 Claims, 7 Drawing Sheets

(56) References Cited

U.S. PATENT DOCUMENTS

2008/0043383 A1    2/2008  Shah
2010/0312505 A1*  12/2010  Berger .................... H02H 3/44
                                                                  702/58
2012/0239319 A1    9/2012  Singh

OTHER PUBLICATIONS

Gerber Dominic et al.; "Gate Unit With Improved Short-Circuit Detection and Turn-Off Capability for 4.5-kV Press-Pack IGBTs Operated at 4-kA Pulse Current"; IEEE Transactions on Plasma Science, IEEE Service Center; vol. 41; No. 10; Oct. 1, 2013; pp. 2641-2648; New Jersey, U.S.A.

Guillod T. et al.; "Design of a PCB Rogowski Coil based on the PEEC Method"; Intergrated Power Electronics Systems; 2012 7th International Conference on, VDE Verlag GMBH; Mar. 6, 2012; pp. 1-6; XP032181456; ISBN: 978-3-8007-3414-6.

\* cited by examiner

SHORT-CIRCUIT SENSOR

CROSS-REFERENCE TO RELATED APPLICATIONS

The present application is a 371 national phase filing of International Application No. PCT/EP2015/056081, entitled "SHORT-CIRCUIT SENSOR", filed 23 Mar. 2015, which claims priority to German Patent Application No. 10 2014 106 130.6, entitled "KURZSCHLUSSSENSOR", filed 30 Apr. 2014.

BACKGROUND

The present disclosure relates to a short-circuit sensor for detecting a short-circuit current in a power line, for example a power system power line with 50/60 Hz.

In short-circuit sensors, a possible short-circuit current is differentiated from a normal overcurrent. A short-circuit current typically rises very much more rapidly than a normal switch-on current of a consumer or electric motor.

SUMMARY

The object on which the disclosure is based is to specify a short-circuit sensor which permits improved differentiation between a normal overcurrent and a short-circuit current.

This object is achieved by the subject matter having the features as claimed in the independent claims. Advantageous examples of the principles of this disclosure are the subject matter of the figures, of the description and of the dependent claims.

According to a first aspect of the disclosure, the object is achieved by means of a short-circuit sensor for detecting a short-circuit current in an electrical line, having an integrator; and a coupling device which is designed to couple the integrator inductively to the electrical line and to feed an induced signal to the integrator; wherein the integrator is designed to integrate the induced signal in order to obtain an integrated signal; and a detection device which is designed to compare an amplitude value of the integrated signal with a predefined threshold value and to detect the short-circuit current if the amplitude value of the integrated signal exceeds the predefined threshold value. This provides, for example, the technical advantage that rapid detection of a short-circuit takes place and switching off can be initiated in a short time. As a result of the inductive coupling, low frequencies can be damped, and a relatively short reaction time up to the switching off can be made possible. The short-circuit sensor is, for example, a printed circuit board current sensor for three-phase current applications.

In one advantageous example of the short-circuit sensor, the integrator has a filter characteristic with a lower cut-off frequency which is above a power system frequency. The power system frequency is, for example, 16.33 Hz, 50 Hz, 60 Hz or 400 Hz. This provides, for example, the technical advantage that strong damping of frequencies below the cut-off frequency is achieved with the short-circuit sensor. Signals with a frequency of 50 Hz, which occur in motor controllers, and motor starts in this frequency range are, for example, not detected and incorrectly interpreted.

In a further advantageous example of the short-circuit sensor, the cut-off frequency is selected in such a way that the integrating effect for the useful signal is minimal. This provides, for example, the technical advantage that the useful signal is not adversely affected by the filter characteristic. The short-circuit sensor has a cut-off frequency at which the functional range of the short-circuit sensor begins.

In a further advantageous example of the short-circuit sensor, the integrator comprises a capacitor and a resistor, wherein the capacitor and the resistor form an RC element, or wherein the integrator is implemented by means of a processor, wherein the processor is designed to integrate the induced signal digitally, or wherein the integrator is formed by means of an operational amplifier circuit comprising an RC element. This provides, for example, the technical advantage that the capacitor serves as an analog memory in which the voltage is added over time. In addition, for example the technical advantage is provided that the short-circuit sensor obtains the original form of a voltage.

In a further advantageous example of the short-circuit sensor, the coupling device comprises a first inductance for inductively coupling the coupling device to the electrical line. The first coil is, for example, a planar coil, an air coil, a spiral flat coil, a cylinder coil or an annular coil. This provides, for example, the technical advantage that efficient inductive coupling is achieved.

In a further advantageous example of the short-circuit sensor, the integrator is connected downstream of the first inductance. This provides, for example, the technical advantage that an induced signal can easily be supplied.

In a further advantageous example of the short-circuit sensor, the coupling device comprises a second inductance which is inductively coupled to the first inductance. This provides, for example, the technical advantage that the short-circuit sensor can be inserted into the power line in a serial fashion. The power line has an inductance as a result of its own magnetic field, which inductance is used to inductively couple to the second inductance.

In a further advantageous example of the short-circuit sensor, the short-circuit sensor comprises terminals for connecting the electrical line to the coupling device. As a result, for example the technical advantage is provided that the short-circuit sensor can easily be integrated into the power line.

In a further advantageous example of the short-circuit sensor, the short-circuit sensor comprises a switch-off device for interrupting the electrical line. This provides, for example, the technical advantage that rapid detection of a short-circuit takes place and switching off can be initiated in a short time.

In a further advantageous example of the short-circuit sensor, the detection device is designed to actuate the switch-off device in the case of a detected short-circuit, in order to interrupt the electrical line. This also provides, for example, the technical advantage that switching off is initiated in a short time and damage to electronics by the short-circuit is prevented.

In a further advantageous example of the short-circuit sensor, the one detection device is designed to compare a multitude of amplitude values of the integrated signal with the predefined threshold value and to detect the short-circuit current if one of the amplitude values of the integrated signal exceeds the predefined threshold value. This also provides, for example, the technical advantage that the short-circuit current can be detected reliably.

In a further advantageous example of the short-circuit sensor, the detection device is connected downstream of the integrator and comprises a processor, wherein the processor implements a comparator which is designed to compare the amplitude value of the integrated signal with the predefined threshold value. This also, for example, provides the technical advantage that a short-circuit detection means which can be configured in a flexible way is implemented.

In a further advantageous example of the short-circuit sensor, the processor is designed to output a switch-off signal in order to interrupt the electrical line if a short-circuit is detected. This also provides, for example, the technical advantage that a switch-off device can be actuated.

In a further advantageous example of the short-circuit sensor, the short-circuit sensor also comprises an analog/digital converter for digitizing the induced signal or the integrated signal. This also, for example, provides the technical advantage that digital processing of the signal can be carried out.

According to a second aspect of the disclosure, the object is achieved by means of a method for detecting a short-circuit current in an electrical line by means of a short-circuit sensor, wherein the short-circuit sensor comprises an integrator and a coupling device for inductively coupling the integrator to the electrical line, in order to feed an induced signal to the integrator, wherein the method comprises the steps of integration of the induced signal by the integrator in order to obtain an integrated signal; and comparing an amplitude value of the integrated signal with a predefined threshold value in order to detect the short-circuit current if the amplitude value of the integrated signal exceeds the predefined threshold value. This provides the same technical advantages as those provided by the short-circuit current sensor according to the first aspect.

In one advantageous example of the method, the method comprises the step of interrupting the electrical line when a short-circuit current is detected. This provides, for example, the technical advantage that damage to electronics by the short-circuit is prevented.

BRIEF DESCRIPTION OF THE DRAWINGS

Examples of the principles of this disclosure are illustrated in the drawings and will be described in more detail below.

DETAILED DESCRIPTION

Figure 1:
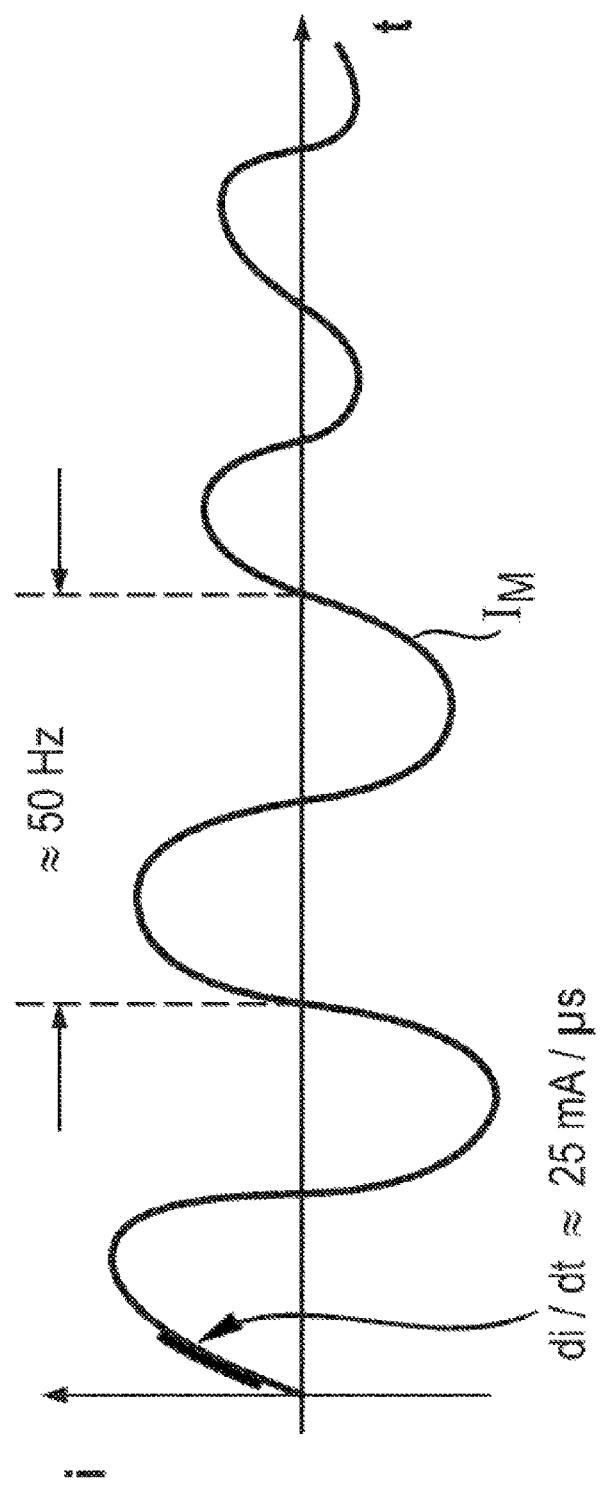
FIG. 1 shows a diagram of a start-up current in a motor.

FIG. 1 shows a diagram of a start-up current i in an electric motor as a function of the time t. The electric motor is operated with an oscillating current $I_M$ which has a frequency of 50 Hz. Typical rates of rise of the current in the case of a motor start are approximately 25 mA/μs. In the case of a normal motor start, amplitudes from 6 to $10 \times I_{nom}$ are reached at the switch-on time of the motor.

Figure 2:
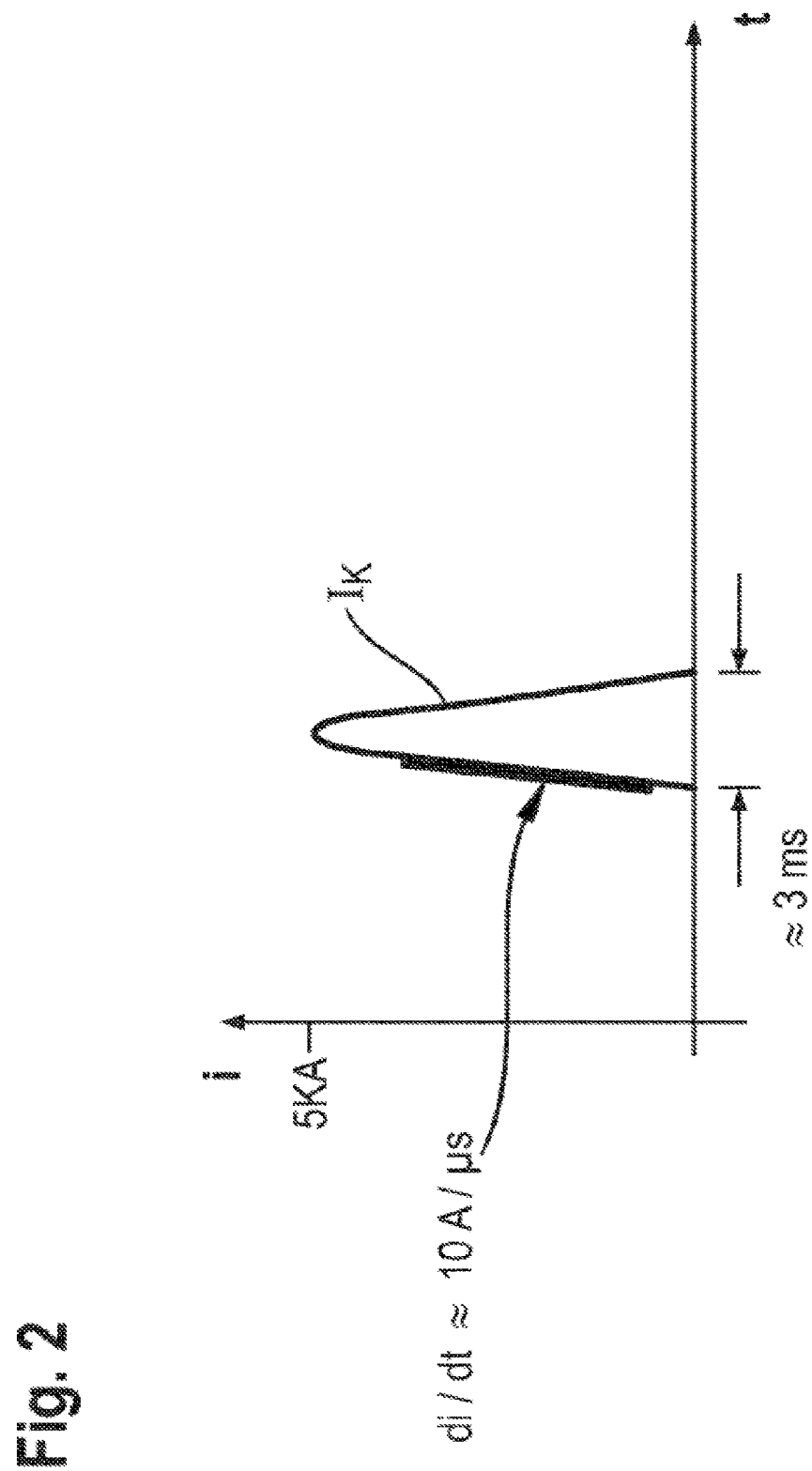
FIG. 2 shows a diagram of a current in the case of a short-circuit.

FIG. 2 shows a diagram of a current i in the case of a short-circuit as a function of the time t. A short-circuit current has a very much faster rise than a current in the case of a motor start. A short-circuit current has, for example, a rate of rise of the current of 10 A/μs.

When current converters are used to detect short-circuit currents, the thresholds for the triggering are very low, with the result that they can already be reached by a motor start. In this case, faulty detection of a supposed short-circuit current and initiation of switching off take place.

In order to solve this problem, a short-circuit sensor with a microprocessor continuously evaluates the rise time di/dt. However, it is generally possible to use calculation devices other than a microprocessor. The microprocessor continuously calculates the rate of rise of the current di/dt and compares it with a reference value. An A/D converter can be arranged upstream of the processor, or the processor converts analog signals into digital signals.

As soon as the rate of rise of the current di/dt is above a specific reference value, the presence of a short-circuit is detected. However, this calculation is not absolutely necessary. It is also possible to compare the sensor output voltage directly with the reference value and to use the latter as a measure. The low frequencies of, for example, a motor start-up current are damped owing to the system and therefore do not trigger the threshold value.

Figure 3:
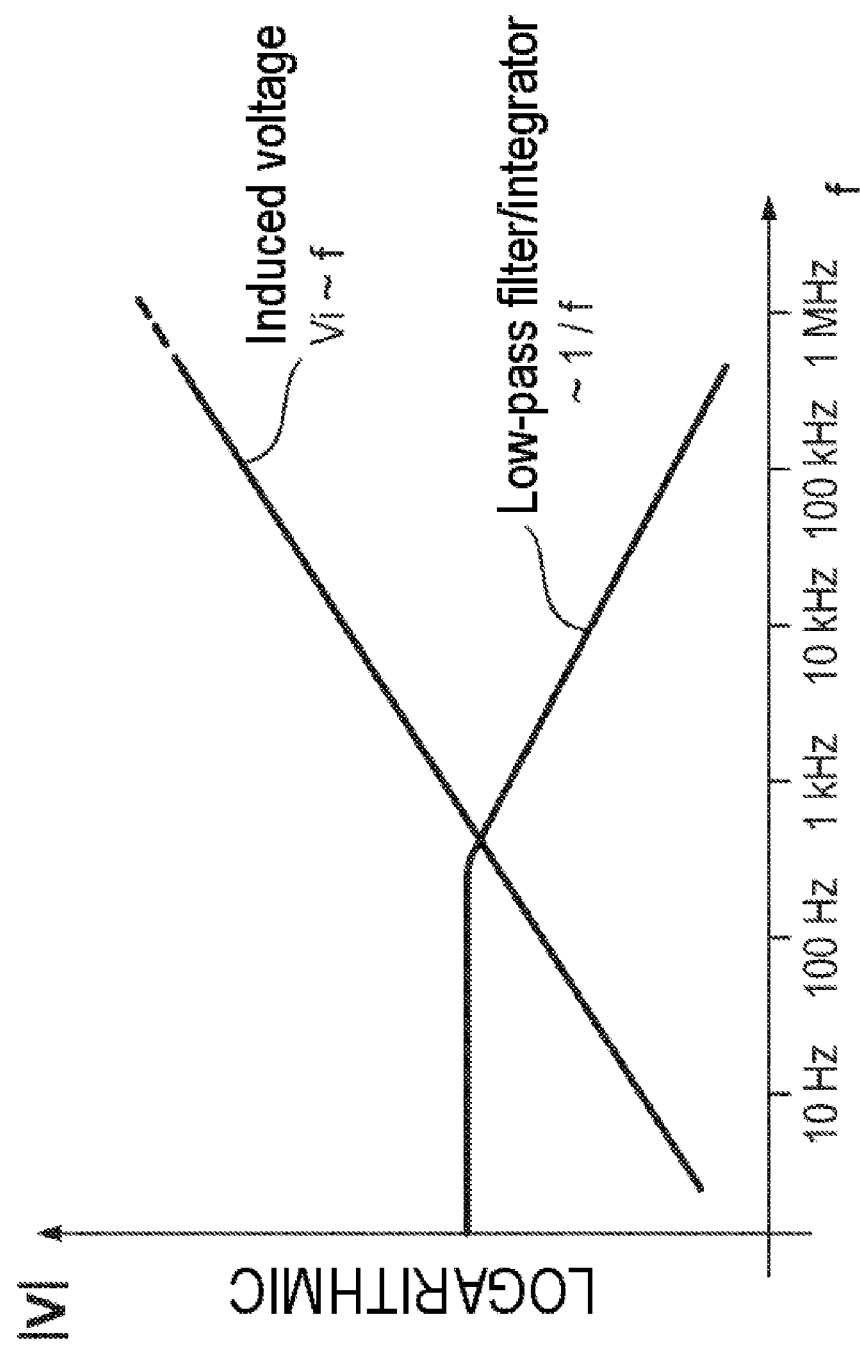
FIG. 3 shows a diagram of an induced voltage as a function of the frequency and a frequency response of a low-pass filter.

FIG. 3 shows a double logarithmic diagram of an induced voltage $U_{ind}$ and of a frequency response of a low-pass filter or integrator as a function of the frequency f. High-frequency signals are predominantly transmitted through inductive coupling of the short-circuit sensor to the power line. According to the law of induction this is attributable to the fact that the induced voltage in the short-circuit sensor is proportional to the rise in the current $U_{ind}$~di/dt in a power line. In the frequency range the following applies: $U_{ind}$~jωl. The induced signal can therefore already be a time derivative di/dt. The induced or measurable voltage in the short-circuit sensor therefore increases as the frequency f increases.

In order to obtain an output signal which is proportional to the measurement current, the measurement signal is integrated or low-pass filtered with a 1/f characteristic. If the low-pass filter or integrator is made available with a lower cut-off $f_g$, the output signal $V_{out}$ illustrated in FIG. 4C is obtained. The characteristic of the output signal is obtained from the multiplication of the two frequency profiles from FIG. 3. Starting from the cut-off frequency $f_g$ of the low-pass filter, an output signal is obtained which has a profile which is proportional to that of the measurement current. At very high frequencies, the behavior can change owing to parasitic effects (not illustrated). There is therefore a resulting functional range of the short-circuit sensor ranging from the adjustable cut-off frequency $f_g$ as far as an upper natural cut-off frequency. This functional range is selected according to the disclosure in such a way that spectra of typical short-circuit current profiles correspond well to the functional range and can therefore be detected well. Low frequencies of the useful signal are only weakly transmitted as a result of the inductive coupling, and are not amplified, or only amplified to a small extent, as a result of the lower cut-off frequency of the integrator or low-pass filter, so that effectively only a very weak transmission occurs, which is desired according to the disclosure. It is therefore possible to achieve good separation between the useful signal and the short-circuit signals to be detected by means of the short-circuit sensor.

Figure 4A:
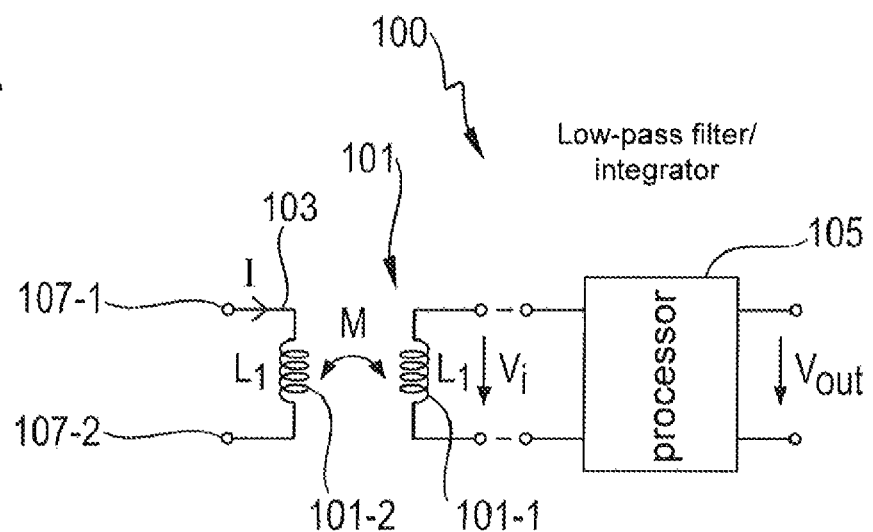
FIG. 4A and FIG. 4B show a schematic views of flail short-circuit sensors.

FIG. 4A shows a schematic view of a short-circuit sensor 100. The short-circuit sensor 100 is connected via the terminals 107-1 and 107-2 to a power line 103 at which the short-circuit is to be detected. The short-circuit sensor 100 comprises a coupling device 101 for inductively coupling the short-circuit sensor 100 to the power line 103, in order to detect an induced voltage. The coupling device 101 comprises a first inductance 101-1 for inductively coupling the short-circuit sensor 100 to the power line 103, and a second inductance 101-2 for connecting the short-circuit sensor 100 to the power line 103. The second inductance 101-2 can be formed by the inductive portion of the electrical power line 103.

The short-circuit sensor 100 also comprises an integrator 105 for integrating the induced voltage with a lower cut-off frequency. The integrator 105 is implemented by means of a processor, wherein the processor is designed to integrate the induced signal digitally. Furthermore, the short-circuit sensor 100 comprises a switch-off device for interrupting the electrical line 103.

Figure 4B:
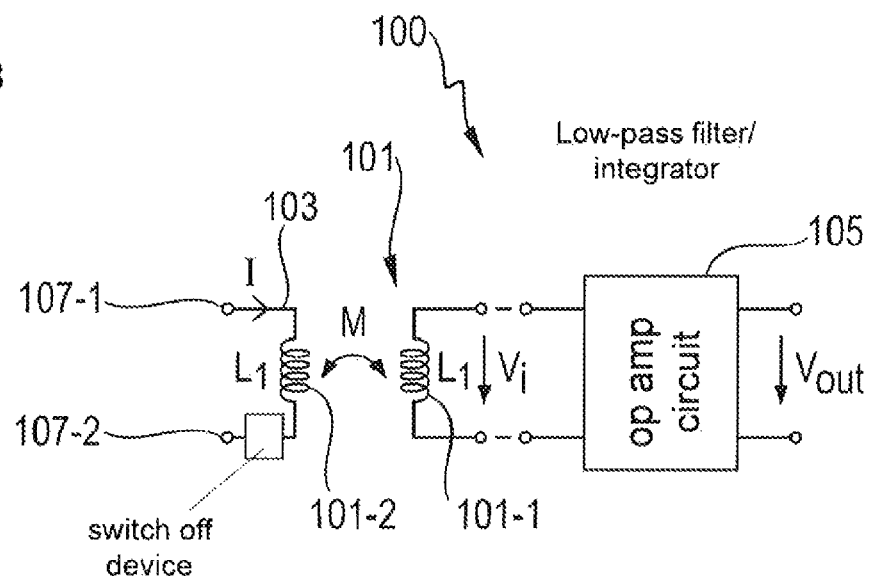
Figure 4C:
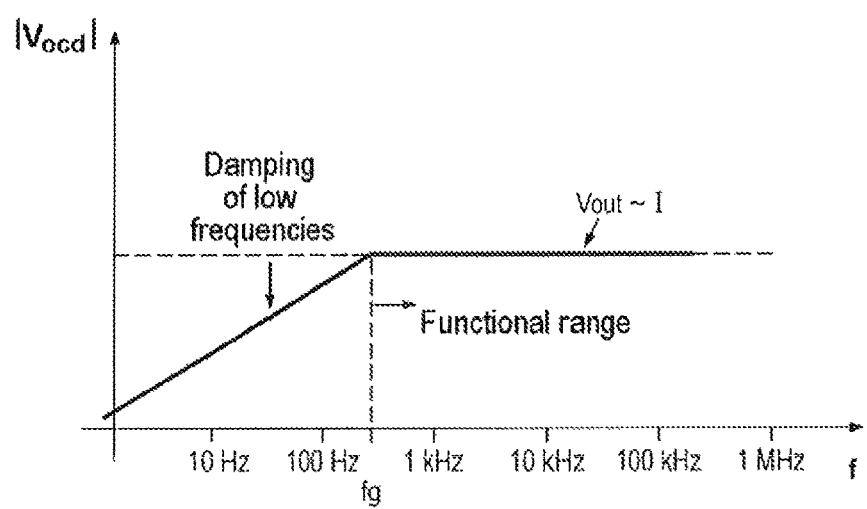
FIG. 4C shows an output signal of a short-circuit sensor.

FIG. 4B shows a schematic view of a short-circuit sensor 100 according to the embodiment shown in FIG. 4A. Notwithstanding, the embodiment according to FIG. 4A, the Integrator in the embodiment of FIG. 4B is implemented by means of an operational amplifier circuit (op amp circuit), comprising an RC-element. The short-circuit sensor 100 may include a switch-off device, as further shown in FIG. 4B.

In a refinement of FIG. 4A or FIG. 4B, it is also possible to place an original power line in the spatial vicinity of the short-circuit sensor and to detect short-circuit currents without interrupting the power line, which permits, for example, subsequent mounting of the short-circuit sensor on existing systems, without having to interrupt the power lines. In this case, the terminals 107-1 and 107-2 are not required.

The short-circuit sensor 100 also comprises an integrator 105 for integrating the induced voltage with a lower cut-off frequency or a low-pass filter 105 for low-pass filtering the induced voltage. The low-pass filter 105 is a filter which permits signal components with frequencies below a cut-off frequency $f_g$ to pass through with approximatively no attenuation. In contrast, components with relatively high frequencies are attenuated. The integrator 105 is a circuit with frequency-dependent negative feedback, for example in the form of a capacitor 111. The capacitor 111 serves here as an analog memory in which an input voltage is added over time.

The integrator 105 comprises a resistor 109 and a capacitor 111 which together form an RC element. For low frequencies below the cut-off frequency $f_g$, system-induced damping occurs as a result of the inductive coupling, which is used not to measure low-frequency currents in the power line 103 or to measure them with a high level of damping. If the cut-off frequency is selected above a frequency of 50 Hz, strong damping of 50 Hz signals can be reached. Motor starts or other power events which lie in this frequency range are not detected, and they therefore cannot be misinterpreted.

FIG. 4C shows FIG. 4C shows an example output signal of the short-circuit sensor 100 of FIG. 4A or FIG. 4B.

Figure 5:
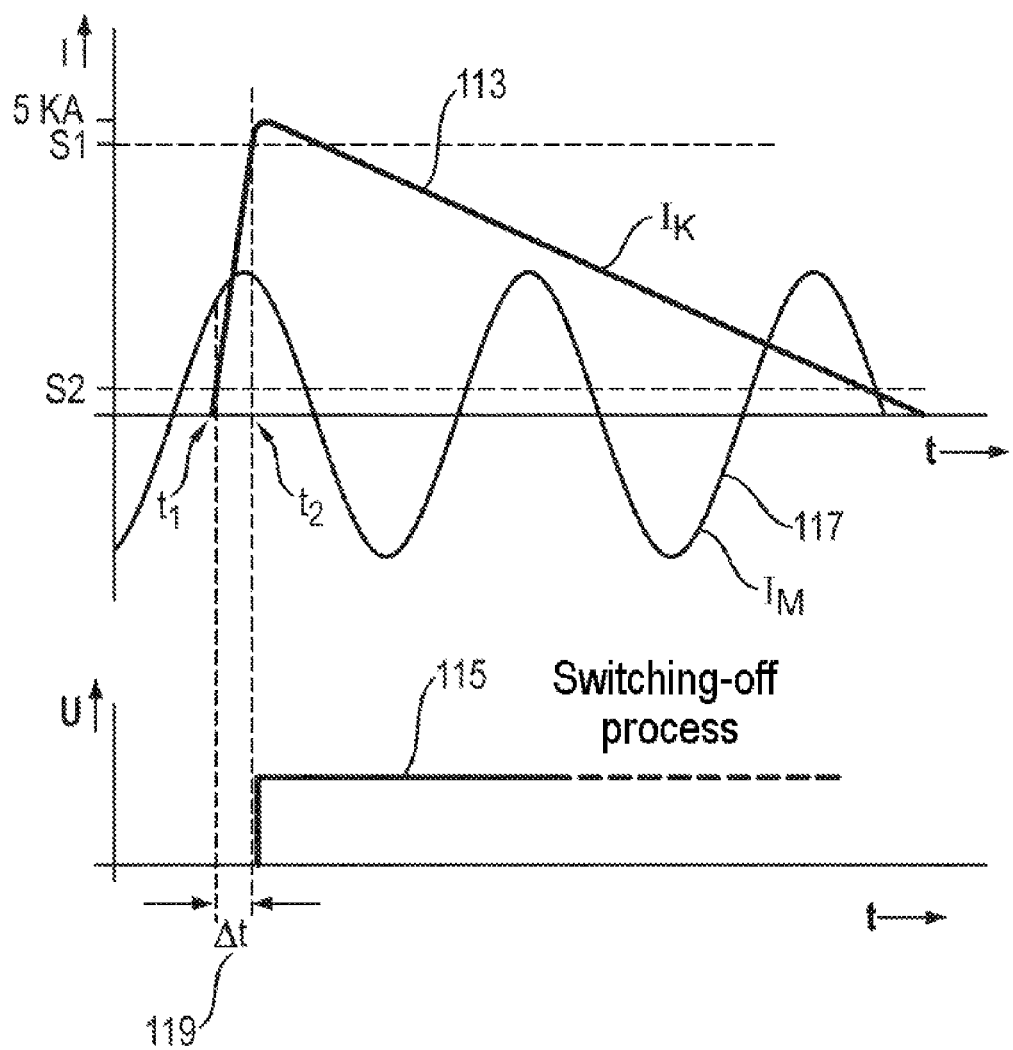
FIG. 5 shows a diagram of a time profile of a short-circuit and a switching-off process.

FIG. 5 shows a diagram of a time profile of a short-circuit 113 and of a switching-off process 115. A threshold for the detection of a short-circuit 113 can be lowered from the reference value S1 to S2 by means of the short-circuit sensor 100. In this case, the threshold S2 can be below the amplitude $I_M$ 117.

The reaction time of the short-circuit sensor 100 is shortened by a time interval Δt 119. As a result of this measure, loading in a motor switch or some other sensitive electronics is reduced and at the same time the probability of reliable functional capability after the short-circuit is increased. The short-circuit sensor 100 can use a combination of the low-pass filter and a processor for continuously calculating a value of the change in the current, in order to ensure precise detection of a short-circuit current. After detection of a short-circuit by the short-circuit sensor 100, a switching-off process 115 or a current bypass can be switched in order to protect electronic assemblies and semiconductors.

The reference number 113 denotes a current profile of a typical short-circuit current. The reference number 117 denotes a rated current or motor start-up current. The rise time of the short-circuit current is significantly steeper or faster than that of the rated current. If the short-circuit sensor 100 were to react in a frequency-independent fashion and therefore were to be able to react only to the amplitude of the current signal, a detection threshold S1 would have to be selected, which is reached at the time t2. Starting from this time, an auxiliary switching-off process could be initiated. The current and the energy at this time can already be very high.

The detection threshold can be reduced from S1 to S2 by means of the frequency-dependent configuration of the short-circuit sensor 100. As a result of the damping of low frequencies, a rated current signal 117 cannot trigger the short-circuit sensor 100 despite the fact that the threshold S2 is reached, since the short-circuit sensor 100 has overall a high-pass characteristic with a cut-off frequency which is higher than the rated current frequency and therefore does not detect the signal of the rated current despite the threshold S2 having been reached.

As soon as a short-circuit current with a rapid rate of rise, i.e. high frequency, reaches the threshold S2, the short-circuit is detected and the protective device (e.g. the auxiliary short-circuit) can be initiated. As a result of the reduction in the threshold from S1 to S2, the reaction time of the sensor can be improved by Δt (t2-t1) and a switching-off process can be reached earlier. This can produce the various advantages.

All of the features which are explained and shown in conjunction with individual examples of the principles of this disclosure can be provided in different combinations in the subject matter according to the disclosure in order to implement their advantageous effects simultaneously.

The scope of protection of the present disclosure is determined by the claims and is not limited by the features which are explained in the description or shown in the figures.

LIST OF REFERENCE NUMBERS 100 short-circuit sensor
101 coupling device
101-1 first inductance
101-2 second inductance
103 power line
105 integrator/low-pass filter
107-1 terminal
107-2 terminal
109 resistor
111 capacitor
113 short-circuit
115 switching-off process
117 amplitude
119 time interval

What is claimed is:
1. A short-circuit sensor for detecting a short-circuit current in an electrical line, having:
an integrator; and a coupling device configured to couple the integrator inductively to the electrical line and to feed an induced signal to the integrator;

wherein the integrator is configured to integrate the induced signal to obtain an integrated signal, and wherein the integrator has a filter characteristic with a lower cut-off frequency which is above a power system frequency; and a detection device configured to compare an amplitude value of the integrated signal with a predefined threshold value and to detect the short-circuit current if the amplitude value of the integrated signal exceeds the predefined threshold value.

2. The short-circuit sensor according to claim 1, wherein the integrator is selected from the group consisting of: a capacitor and a resistor, wherein the capacitor and the resistor form an RC element; a processor configured to integrate the induced signal digitally; and an operational amplifier circuit comprising an RC element.

3. The short-circuit sensor according to claim 1, wherein the coupling device comprises a first inductance for inductively coupling the coupling device to the electrical line.

4. The short-circuit sensor according to claim 3, wherein the integrator is connected downstream of the first inductance.

5. The short-circuit sensor according to claim 3, wherein the coupling device comprises a second inductance which is inductively coupled to the first inductance.

6. The short-circuit sensor according to claim 5, wherein the short-circuit sensor comprises terminals for connecting the electrical line to the coupling device.

7. The short-circuit sensor according to claim 1, wherein the short-circuit sensor comprises a switch-off device for interrupting the electrical line.

8. The short-circuit sensor according to claim 7, wherein the detection device is configured to actuate the switch-off device in response to a detected short-circuit to interrupt the electrical line.

9. The short-circuit sensor according to claim 1, wherein the detection device is configured to compare a plurality of amplitude values of the integrated signal with the predefined threshold value and to detect the short-circuit current if one of the amplitude values of the integrated signal exceeds the predefined threshold value.

10. The short-circuit sensor according to claim 1, wherein the detection device is connected downstream of the integrator and comprises a processor, wherein the processor implements a comparator configured to compare the amplitude value of the integrated signal with the predefined threshold value.

11. The short-circuit sensor according to claim 10, wherein the processor is configured to output a switch-off signal in order to interrupt the electrical line if a short-circuit is detected.

12. The short-circuit sensor according to claim 1, further comprising an analog to digital converter configured to digitize the induced signal or the integrated signal.

13. A method for detecting a short-circuit current in an electrical line by means of a short-circuit sensor, comprising:

receiving, through a coupling device, an induced signal corresponding to a signal on an electrical line;

filtering the induced signal using a lower cut-off frequency, wherein the lower cut-off frequency is above a power system frequency;

integrating the induced signal to obtain an integrated signal;

comparing an amplitude value of the integrated signal with a predefined threshold value; and detecting the short-circuit current if the amplitude value of the integrated signal exceeds the predefined threshold value.

14. The method according to claim 13, further comprising interrupting the electrical line when a short-circuit current is detected.

15. The method according to claim 14, further comprising:

outputting a switch-off signal to interrupt the electrical line if the short-circuit current is detected.

16. The method according to claim 13, wherein comparing the amplitude value of the integrated signal with the predefined threshold value comprises:

comparing a plurality of amplitude values of the integrated signal with the predefined threshold value;

wherein the short-circuit current is detected if one of the amplitude values of the integrated signal exceeds the predefined threshold value.

* * * * *